United States Patent

Mori et al.

[11] Patent Number: 5,206,783
[45] Date of Patent: Apr. 27, 1993

[54] PORTABLE SEMICONDUCTOR MEMORY UNIT

[75] Inventors: Yoshihide Mori, Kawanishi; Takayuki Shinohara, Itami, both of Japan

[73] Assignee: Mitsubishi Denki Kabushiki Kaisha, Tokyo, Japan

[21] Appl. No.: 715,962

[22] Filed: Jun. 17, 1991

[30] Foreign Application Priority Data

Aug. 18, 1990 [JP] Japan .................. 2-217613

[51] Int. Cl.⁵ .................. H05F 3/00; H05F 3/04
[52] U.S. Cl. .................. 361/212; 361/220; 361/56
[58] Field of Search .......... 361/212, 220, 424, 399, 361/119, 56; 235/492; 174/35 R; 379/412, 437

[56] References Cited

U.S. PATENT DOCUMENTS

| | | | |
|---|---|---|---|
| 3,887,848 | 6/1975 | Larson et al. | 361/56 |
| 4,617,605 | 10/1986 | Obrecht et al. | 361/220 |
| 4,661,889 | 4/1987 | Fushimoto | 361/424 |
| 4,667,266 | 5/1987 | Masuoka et al. | 361/212 |
| 4,795,898 | 1/1989 | Bernstein et al. | 235/492 X |
| 4,817,234 | 4/1989 | Greulich | 361/118 X |

FOREIGN PATENT DOCUMENTS

3715715A1 12/1987 Fed. Rep. of Germany ...... 361/212
2151411 7/1985 United Kingdom .

*Primary Examiner*—A. D. Pellinen
*Assistant Examiner*—Fritz M. Fleming
*Attorney, Agent, or Firm*—Oblon, Spivak, McClelland, Maier & Neustadt

[57] ABSTRACT

A semiconductor memory unit has a card body (1) with conductive panels (2, 2') on its surface. Insulating layers (10, 10') are provided on the inside of the conductive panels (2, 2'). A circuit board (5) is provided in the card body (1). A battery contacting member (8) is located close to one of the insulating layers (10, 10'), and is connected with a circuit grounding terminal. A portion (10a) of the insulating layer (10), which is opposed to the battery contacting member (8), is formed to have lower electrostatic breakdown voltage than the other portions of the insulating layers (10, 10'). Thus, when a high voltage ESD noise is applied to the conductive panels (2, 2'), the noise is discharged to the ground through the portion (10a) of the insulating layer (10) and the battery contacting member, so that the memory unit can be free from the bad influence of the noise.

4 Claims, 3 Drawing Sheets

PORTABLE SEMICONDUCTOR MEMORY UNIT

BACKGROUND OF THE INVENTION

1. Field of the Invention

This invention relates to a portable semiconductor memory unit, such as an IC card used as the external memory device of a personal computer and so on, and more particularly, it relates to a structure of a portable semiconductor memory unit devised to exclude the influence of electrostatic discharge.

2. Description of the Prior Art

In FIGS. 1 and 2, there is shown a conventional IC card of the type having conductive panels on its surface.

In those drawings, a card body 1 has conductive panels 2 and 2', which are made of conductive metal, for example, on its surface. A connector 3 having a plurality of connecting terminals therein, is provided at the side of the card body 1.

A circuit grounding terminal 4 is provided in the connector 3, and is connected to a grounded circuit or ground interconnection 5a of a circuit board 5. The circuit board 5 is provided in the card body 1, and electronic elements 6, such as an integrated circuit module, are arranged thereon.

When the card body 1 is loaded into the read/write device of a personal computer, the circuit grounding terminal 4 comes in contact to a grounded circuit of such device, and is grounded hereby.

An internal battery cell 7 is supported by the battery contacting members 8 and 9, the ends of which are fixed to the circuit board 5 and respectively connected to printed circuits provided on the circuit board 5.

The battery contacting member 8 is contacted with the negative electrode of the battery cell 7 and directly connected to the circuit grounding terminal 4 through the grounded circuit 5a of the circuit board 5.

The battery contacting member 9 is contacted with the positive electrode of the battery cell 7. Insulating layers 10 and 10' are respectively provided on the inside of the conductive panels 2 and 2' to prevent the electric elements 6 and the battery contacting members 8 and 9 from short-circuiting each other. The insulating layers 10 and 10' are formed by coating insulating material, such as synthetic resin, on the panels 2 and 2'.

The conductive panels 2 and 2' are connected to each other by a conductive coiled spring 11 inserted between them, and those panels provide the internal circuits in the card body 1 with an electromagnetic shield effectiveness.

As mentioned above, in the conventional IC card with the conductive panels on its surface, these conductive panels 2 and 2' are electrically insulated from the circuit grounding terminal 4.

When the IC card is inserted into the read/write device of the personal computer, the circuit grounding terminal 4 is grounded through the grounded circuit of the device. If low voltage static discharge noise (ESD noise) which is under the electrostatic breakdown voltage between the conductive panels 2, 2' and the circuit grounding terminal 4 is applied to the panels 2 and 2', the noise is cut off by the conductive panels 2 and 2'.

As a result, the internal circuits are not influenced.

If the ESD noise is at high voltage which is over the electrostatic breakdown voltage between the conductive panels 2, 2' and the circuit grounding terminal 4, the noise discharges through the conductive panels 2, 2', the internal circuits and the circuit grounding terminal 4.

Since there is no specific discharge channel within the IC card and such a channel is very unstable, the discharge current often flows into the internal electric elements 6, resulting in the destruction of the electric elements 6, changes of data therein or other material troubles.

SUMMARY OF THE INVENTION

In accordance with the present invention, a portable semiconductor memory unit comprises a card body with a conductive panel on its surface, an insulating layer provided on an inside of the conductive panel, a circuit board provided in the card body, the circuit board having a ground interconnection, and a conductive member provided in the card body close to the insulating layer, the conductive member being connected to the ground interconnection, a portion of the insulating layer, which is opposed to the conductive member, having lower electrostatic breakdown voltage than other portions of the insulating layer.

According to this structure, when the low voltage ESD noise is applied to the IC card, the conductive panels shield it out. When the high voltage ESD noise is applied, there is formed the most preferable discharge channel composed of the conductive panels, the low electrostatic breakdown voltage portion of the insulating layer, the conductive member and the ground interconnection.

Therefore, it is an object of the present invention to provide a portable semiconductor memory unit with a simple structure, which has the shield effectiveness for the low voltage ESD noise, and which has the most preferable discharge channel within the IC card to guard the internal circuits against the high voltage ESD noise.

These and other objects, features, aspects and advantages of the present invention will become more apparent from the following detailed description of the present invention when taken in conjunction with the accompanying drawings.

DETAILED DESCRIPTION OF PREFERRED EMBODIMENTS

Figure 3:
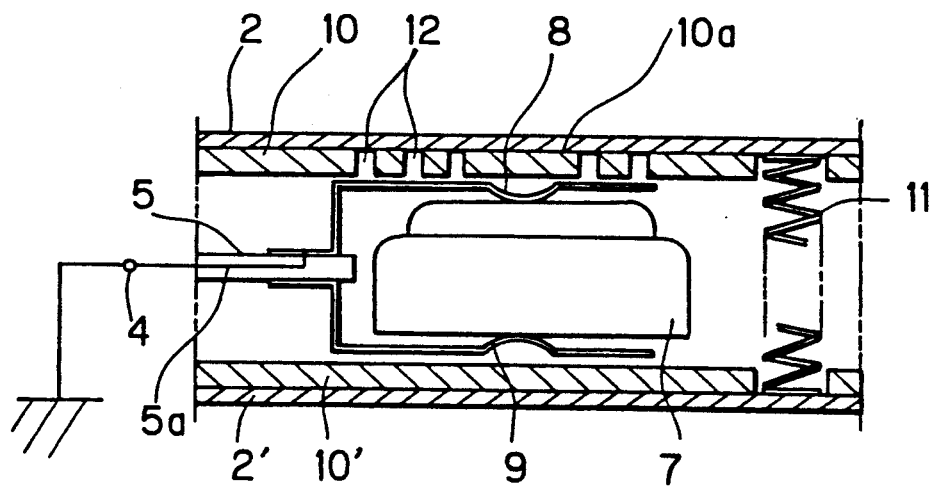
FIG. 3 is a cross sectional view of a key portion according to a preferred embodiment of the present invention.

Some specific embodiments of this invention will be described with referring to accompanying drawings. In FIG. 3, there is shown a first preferred embodiment of this invention.

Figure 1:
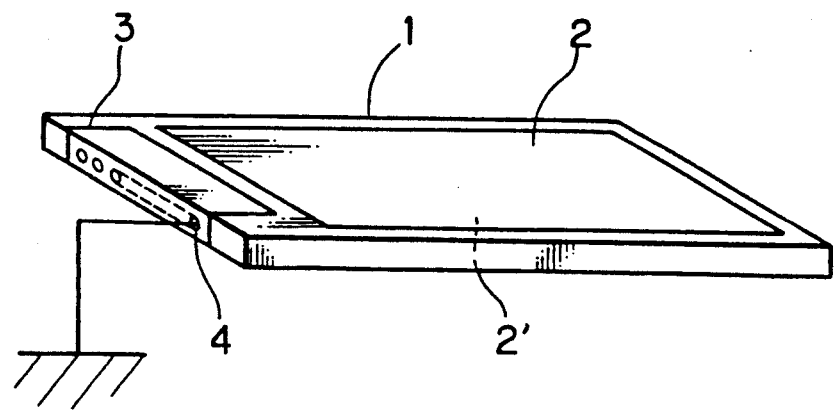
FIG. 1 is a perspective view of a conventional IC card.
Figure 2:
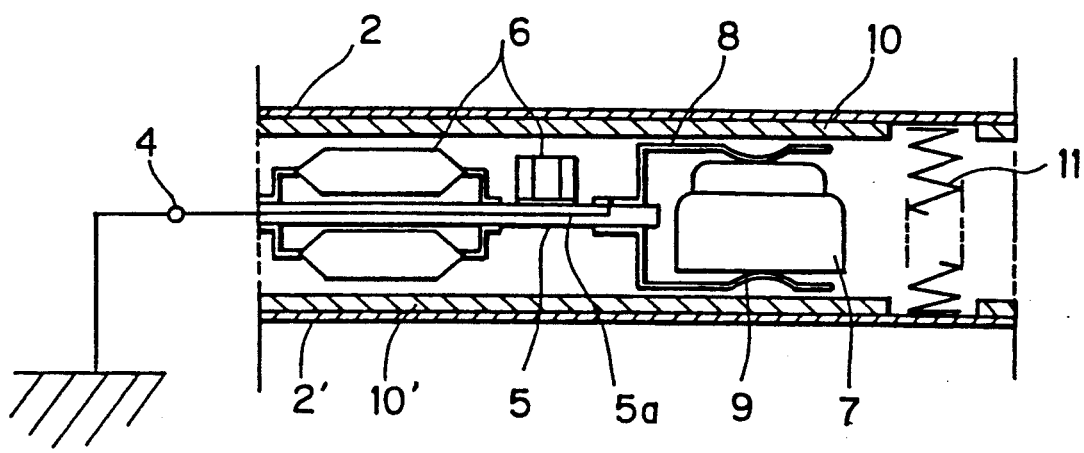
FIG. 2 is a cross sectional view of a key portion of the conventional IC card.

This embodiment of the IC card has almost the same structure as the conventional IC card shown in FIGS. 1 and 2 in the points of its having the card body 1 with the conductive panels 2 and 2' on it surface, the insulating layers 10 and 10' provided on the inside of the conductive panels 2 and 2', the circuit board 5 provided in the card body 1, the electric elements provided on the circuit board 5, the internal battery cell 7, the battery contacting member 8 and 9, the conductive coiled spring 11 connecting the conductive panels 2 and 2' to each other, and so on.

Like symbols are applied for like portions of FIGS. 1 and 2 for simplicity and their detail explanations are omitted hereafter. In that drawing, the battery contacting member 8 is connected to the circuit grounding terminal 4 through the grounded circuit 5a on the circuit board 5, and located close to the inside of the insulating layer 10.

The circuit grounding terminal 4 comes in contact with the grounded circuit of the read/write device of personal computer, when the card is loaded into such device.

The insulating layer 10 has a portion 10a with a plurality of pin holes 12, which is opposed to the battery contacting member 8.

Having a plurality of pin holes 12, the electrostatic breakdown voltage at the portion 10a is lower than the other portions of the insulating layers 10 and 10'.

The diameter of each pin hole 12 is small enough to prevent the battery contacting member 8 from being contacted with the conductive panel 2.

In the above-mentioned structure, since the dielectric constant of the air, in the pin holes 12, is small, there is provided a parallel plate capacitor with small capacitance composed of the conductive panel 2, the low electrostatic breakdown voltage portion 10a and the battery contacting member 8.

The battery contacting member 8 is grounded through the grounded circuit or ground interconnection 5a and the circuit grounding terminal 4. When the high voltage ESD noise is applied to the conductive panels 2 and 2', a discharge current flows from the conductive panel 2 to the circuit grounding terminal 4, selecting the discharge channel of the lowest capacity.

As mentioned above, since the capacitance between the panel 2 and the battery contacting member 8 at the portion 10a is lower than at the other portions, there is formed the shortest discharge channel composed of the conductive panel 2, the portion 10a, the battery contacting member 8, the grounded circuit 5a and the circuit grounding terminal 4, and the discharge current hereof flows surely through that channel without any influence on electric elements (not shown) connected to the circuit board 5.

Therefore, there is no fear of the destruction of electric elements on the circuit board, changes of data therein or other material troubles which are conventionally caused due to the high voltage ESD noise.

When the low voltage ESD noise is applied, such noise is shielded out by the conductive panels 2 and 2', and does not reach to the internal circuits therein.

Figure 4:
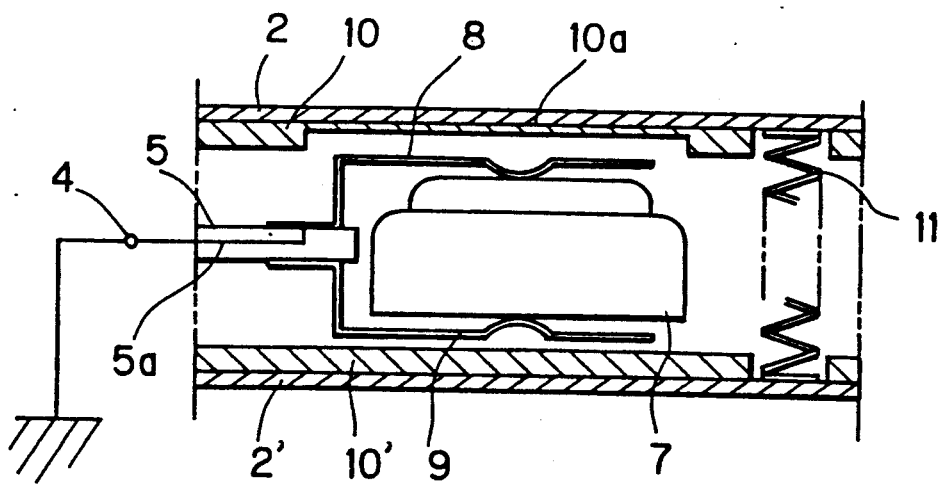
FIG. 4 is a cross sectional view of the key portion according to another preferred embodiment of the present invention.

In FIG. 4, there is shown a second preferred embodiment of this invention.

In this embodiment, the portion 10a of the insulating layer 10 is formed to be thinner than the other portions of the insulating layers 10 and 10', in place of having a plurality of pin holes 12.

Since the thickness of the insulating layer at the portion 10a is smaller, the capacity of it is lower than the other portions of the insulating layers 10 and 10'. As a result, there is provided the same effectiveness as the first embodiment.

Figure 5:
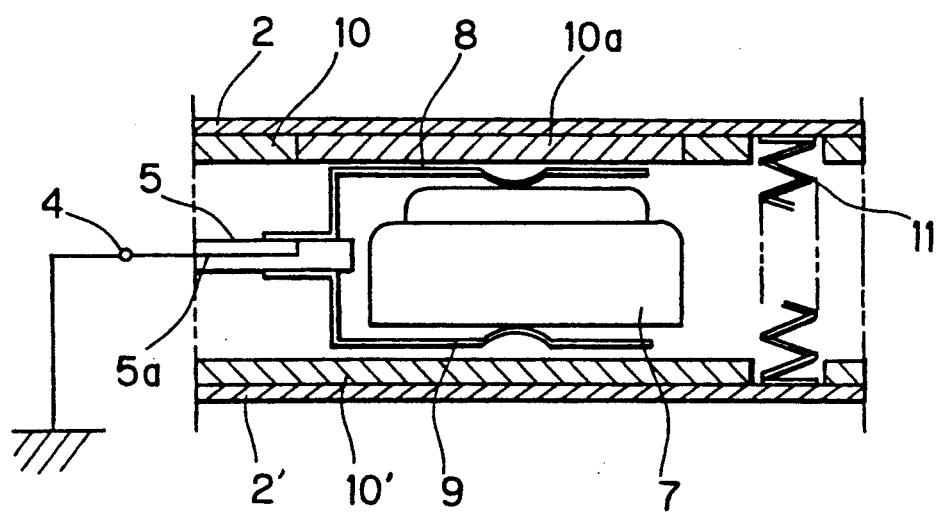
FIG. 5 is a cross sectional view of the key portion according to still another preferred embodiment of the present invention.

In FIG. 5, there is shown a third preferred embodiment of this embodiment. In this embodiment, another insulating material which has lower electric constant than that of the insulating layers 10 and 10', is used for the portion 10a. This embodiment also provides the same effectiveness as the above-mentioned preferred embodiments.

In all of above-described embodiments, the battery contacting member 8 is located close to the insulating layer 10 and is formed to be a part of the discharge channel, however, another conductive member which is connected to the circuit grounding terminal 4, may be provided close to the low electrostatic breakdown voltage portion of the insulating layer 10 or 10'.

Although the present invention has been described and illustrated in detail, it is clearly understood that the same is by way of illustration and example only and is not to be taken by way of limitation. The spirit and scope of the present invention should be limited only by the terms of the appended claims.

What is claimed is:

1. A portable semiconductor memory unit, comprising:
    an IC card having an internal battery;
    a card body with a conductive panel on an outer surface;
    an insulating layer provided on an inner surface of said card body;
    a circuit board provided in said card body, said circuit board having a ground interconnection; and
    said internal battery supported between a positive and a negative contact electrodes connected to the circuit board and approximately parallel to a length of said card body, said negative contact electrode connected to the ground interconnection;
    a portion of said insulating layer, which is opposed to said negative contact electrode, having a lower electrostatic breakdown voltage than other portions of said insulating layer.

2. A portable semiconductor memory unit in accordance with claim 1, wherein said portion of said insulating layer having a lower electrostatic breakdown voltage includes a portion having a plurality of pinholes formed in said insulating layer.

3. A portable semiconductor memory unit in accordance with claim 1, wherein said portion of said insulating layer having a lower electrostatic breakdown voltage includes a portion made thinner than other portion of said insulating layer.

4. A portable semiconductor memory unit in accordance with claim 1, wherein said portion of said insulating layer having a lower electrostatic breakdown voltage includes a portion formed by other insulating material than that of other portions of said insulating layer.

* * * * *